(12) United States Patent
Kiriyama et al.

(10) Patent No.: US 10,003,321 B2
(45) Date of Patent: Jun. 19, 2018

(54) ENCODER HAVING PHASE ADJUSTER FOR OFFSETTING PHASES OF MULTI-PHASE INPUT SIGNAL

(71) Applicant: MITUTOYO CORPORATION, Kanagawa (JP)

(72) Inventors: Tetsuro Kiriyama, Fujisawa (JP); Toru Yaku, Kawasaki (JP)

(73) Assignee: MITUTOYO CORPORATION, Kanagawa (JP)

( * ) Notice: Subject to any disclaimer, the term of this patent is extended or adjusted under 35 U.S.C. 154(b) by 140 days.

(21) Appl. No.: 15/081,142

(22) Filed: Mar. 25, 2016

(65) Prior Publication Data
US 2016/0294364 A1    Oct. 6, 2016

(30) Foreign Application Priority Data
Apr. 3, 2015   (JP) .................................. 2015-076621

(51) Int. Cl.
*H03H 11/20*     (2006.01)
*H03H 11/22*     (2006.01)

(52) U.S. Cl.
CPC .............. *H03H 11/20* (2013.01); *H03H 11/22* (2013.01)

(58) Field of Classification Search
CPC .......... H03H 11/20; H03H 11/22; G01D 5/347
See application file for complete search history.

(56) References Cited

U.S. PATENT DOCUMENTS

2012/0104236 A1*  5/2012  Thor ................... G01D 5/24404
                                                                250/208.6

FOREIGN PATENT DOCUMENTS

JP      2002-116060      4/2002
JP      2002-162253      6/2002

* cited by examiner

*Primary Examiner* — Tony Ko
(74) *Attorney, Agent, or Firm* — Greenblum & Bernstein, P.L.C.

(57) ABSTRACT

A resistor string outputs sixteen signals with a phase difference of 22.5° by dividing voltage between two adjacent phases of a four-phase input signal with a phase difference of $2\pi/M$ (where M is an integer equal to or greater than 2), and by generating four signals with a delayed phase for each phase of the four-phase input signal. A switch portion selects four signals with a phase difference of 90° from the sixteen signals. Amplifiers output each of the four signals, which are attenuated by dividing the voltage with the resistor string, as a four-phase output signal by amplifying each of the four signals such that an amplitude of the four signals matches the amplitude of the four-phase input signal.

14 Claims, 12 Drawing Sheets

ENCODER HAVING PHASE ADJUSTER FOR OFFSETTING PHASES OF MULTI-PHASE INPUT SIGNAL

CROSS-REFERENCE TO RELATED APPLICATIONS

The present application claims priority under 35 U.S.C. § 119 of Japanese Application No. 2015-076621, filed on Apr. 3, 2015, the disclosure of which is expressly incorporated by reference herein in its entirety.

BACKGROUND OF THE INVENTION

1. Field of the Invention

The present invention relates to a phase adjuster and an encoder.

2. Description of Related Art

These days, encoders are used in order to detect a position of various devices having a driver. An encoder is a displacement position measuring device which can be attached to a driving shaft or a rotation shaft of a machine tool or a coordinate measuring apparatus. In general, an encoder may be a linear encoder for detecting linear displacement and a rotary encoder for detecting a rotational angle. Examples of a detecting method of an encoder include a magnetic type, a capacitive type, and an electromagnetic induction type in addition to a photoelectric type.

In a photoelectric encoder, there is a type which outputs a four-phase main signal including phase A (phase 0°), phase –A (phase 180°), phase B (phase 90°), and phase –B (phase 270°) in which each phase differs by 90° respectively. Hereafter, this main signal is referred to as a four-phase signal with 90° phase difference, or simply as a four-phase signal. By combining this signal with an origin point signal, the photoelectric encoder can output an ABS position (absolute position) with the accuracy of a minimum resolution of interpolation of the main signal.

In addition, in the four-phase signal noted above, the photoelectric encoder can generate a phase a (0°) by subtracting phase –A from phase A; and a phase b (90°) by subtracting phase –B from phase B. In such a case, the photoelectric encoder outputs a two-phase main signal. Hereafter, this main signal is referred to as a two-phase signal with 90° phase difference, or simply as a two-phase signal. Although the number of phases is different between the two-phase signal and the four-phase signal, the technical significance of the two is equivalent.

A shift may occur between a phase of the above-noted four-phase main signal and a phase of the origin point signal, for example, when the photoelectric encoder is attached to a device. As a result, there may be a case where a phase difference between the main signal and the origin point signal cannot be defined to a desired value. Accordingly, the phase difference is generally adjusted by mechanically making fine adjustments, in a movement direction of the encoder, to an attachment position of a detection head. However, since a pulse width of the origin point signal is narrow, adjustments are not possible while observing a size of the origin point signal. Therefore, completion of this adjustment process requires repeated trial and error and takes a long time.

In order to avoid taking a long period of time for the adjustment process, a technique has been suggested in which a phase of a main signal is displaced by a predetermined value by flipping of a switch; and synchronization is achieved between the main signal and an origin point pulse (Japanese Patent Laid-open Publication No. 2002-116060). In this approach, a frequency of trial and error can be reduced compared to the case noted above where fine adjustments are made mechanically. In addition, a technique has been suggested in which the phase adjustment of the main signal described above is automatically controlled by an operation of a CPU (Japanese Patent Laid-open Publication No. 2002-162253).

However, the inventors of the present invention have discovered an issue, discussed below, with respect to the above-noted techniques. According to the techniques in Japanese Patent Laid-open Publication Nos. 2002-116060 and 2002-162253, only rough phase adjustments are possible since a pitch of the phase adjustment is 90°. In such a case, depending on a state of the origin point signal, a situation may arise such that a proper synchronization between the main signal and the origin point signal cannot be performed after the phase adjustment.

FIG. 12 illustrates synchronizations of the main signal and the origin point signals when a pulse width of the origin point signal is large. Originally, the origin point signal preferably includes a pulse width of one cycle ($2\pi$) of a main signal MAIN, as shown in an ideal origin point signal ORG_IDEAL of FIG. 12. However, in reality, in the origin point signal, the pulse width varies and timing for rising and falling of the pulse may vary. For example, as shown in an origin point signal ORG1 of FIG. 12, although there is no movement in the origin point signal around a center of the pulse, the pulse width may have a larger pulse width than an ideal value ($2\pi$). In the example of the origin point signal ORG1, the pulse width is $3\pi$. At this point in time, the rising position of the origin point signal ORG1 is $-3\pi/2$ and the falling position is $3\pi/2$. In addition, an origin point signal ORG2 is defined in which the timing for rising and falling of the origin point signal is delayed by $\pi/8$.

A case is considered in which a phase adjustment with a step of 90° ($\pi/2$) width, as presented in Japanese Patent Laid-open Publication Nos. 2002-116060 and 2002-162253, is performed with respect to these origin point signals ORG1 and ORG2.

When the phases of the origin point signals ORG1 and ORG2 are delayed by 90° ($\pi/2$) and are set as origin points signals ORG10 and ORG20 respectively, as shown in FIG. 12, the origin point signal ORG20 can be understood as having activation states at two positions, phase 0 and phase $2\pi$. In this case, the encoder may detect two origin points at phase 0 and phase $2\pi$, resulting in a mistaken detection of the absolute value of the origin point.

Therefore, in order to prevent the occurrence of such mistaken detections, a technique is required so that the phase adjustment of a main signal which is smaller than 90° (π/2) can be performed.

SUMMARY OF THE INVENTION

The present invention was conceived in light of the circumstances above, and by adjusting a phase of a main signal easily matches a relative phase shift of the main signal with respect to an origin point signal of a displacement position measuring device such as a photoelectric encoder.

A phase adjuster according to one aspect of the present invention includes a resistor string, a switch portion, and amplifiers. The resistor string outputs an MN number of signals with a phase difference of $2\pi/MN$ by dividing voltage between two adjacent phases of an M-phase input signal with a phase difference of $2\pi/M$ (where M is an integer equal to or greater than 2) and generating an N number of signals (where N is an integer equal to or greater than 2) with a phase delay for each of the phases of the M-phase input signal. The switch portion selects an L number of signals with a phase difference of $2\pi/L$ (where L is an integer equal to or greater than 2) from the MN signals. An L number of amplifiers output an L-phase output signal (where L is an integer equal to or greater than 2) by amplifying each of the L number of signals attenuated by dividing the voltage with the resistor string such that an amplitude of the L number of signals matches the amplitude of the M-phase input signal.

Another aspect of the present invention is the phase adjuster described above, in which a first phase, which is one of the two adjacent phases of the M-phase input signal, is input to a first end of an N number of serially connected resistors; and a second phase, which is another phase of the two adjacent phases of the M-phase input signal, is input to a second end of the N number of serially connected resistors.

Another aspect of the present invention is the phase adjuster described above, in which when a combined resistance of the N number of serially connected resistors is defined as $R_{TOTAL}$, a combined resistance $R_E$ of a k number of resistors which is counted kth from the first phase side (where k is an integer fulfilling a relationship $1 \leq k \leq N$) among the N number of serially connected resistors, is expressed by formula (1) below, and a resistance value of the kth resistor, as counted from the first phase side among the N number of serially connected resistors is expressed by formula (2) below.

[Formula 1]

$$R_E = R_{TOTAL} \cdot \frac{\sin\frac{2\pi}{M}}{\sin\frac{2\pi k}{MN} + \sin\left(\frac{2\pi}{M} - \frac{2\pi k}{MN}\right)} \cdot \frac{\sin\frac{2\pi k}{MN}}{\sin\frac{2\pi}{M}} \quad (1)$$

$$= R_{TOTAL} \cdot \frac{\sin\frac{2\pi k}{MN}}{\sin\frac{2\pi k}{MN} + \sin\left(\frac{2\pi}{M} - \frac{2\pi k}{MN}\right)}$$

[Formula 2]

$$R_k = R_E - \sum_{i=1}^{k-1} R_i \quad (2)$$

Another aspect of the present invention is the phase adjuster described above, in which each of the L number of amplifiers amplifies a signal being output from between the kth resistor and a k+1 th resistor, as counted from the first phase side, by $1/\beta_k$, and $\beta_k$ is expressed by formula (3) below.

[Formula 3]

$$\beta_k = \frac{\sin\frac{2\pi}{M}}{\sin\frac{2\pi k}{MN} + \sin\left(\frac{2\pi}{M} - \frac{2\pi k}{MN}\right)} \quad (3)$$

Another aspect of the present invention is the phase adjuster described above, in which the MN number of resistors in the resistor string are serially connected in a ring shape, and the switch portion is configured as a rotary switch including a terminal which can be connected to a node separated by an MN/L number of nodes among the MN number of nodes between the MN number of resistors.

An encoder according to another aspect of the present invention includes any one of the above-noted phase adjusters; a detection portion reading and outputting an origin point signal and the M-phase input signal, which is a main signal; and an origin point signal synchronizer determining a position of the origin point by synchronizing the origin point signal and the L-phase output signal.

According to the present invention, it is possible to perform accurate phase adjustments of a multi-phase input signal with a simple configuration.

The present invention is clarified by the following detailed description and the appended drawings. The appended drawings are referenced only to facilitate understanding and do not serve to limit the present invention.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE INVENTION

Figure 1:
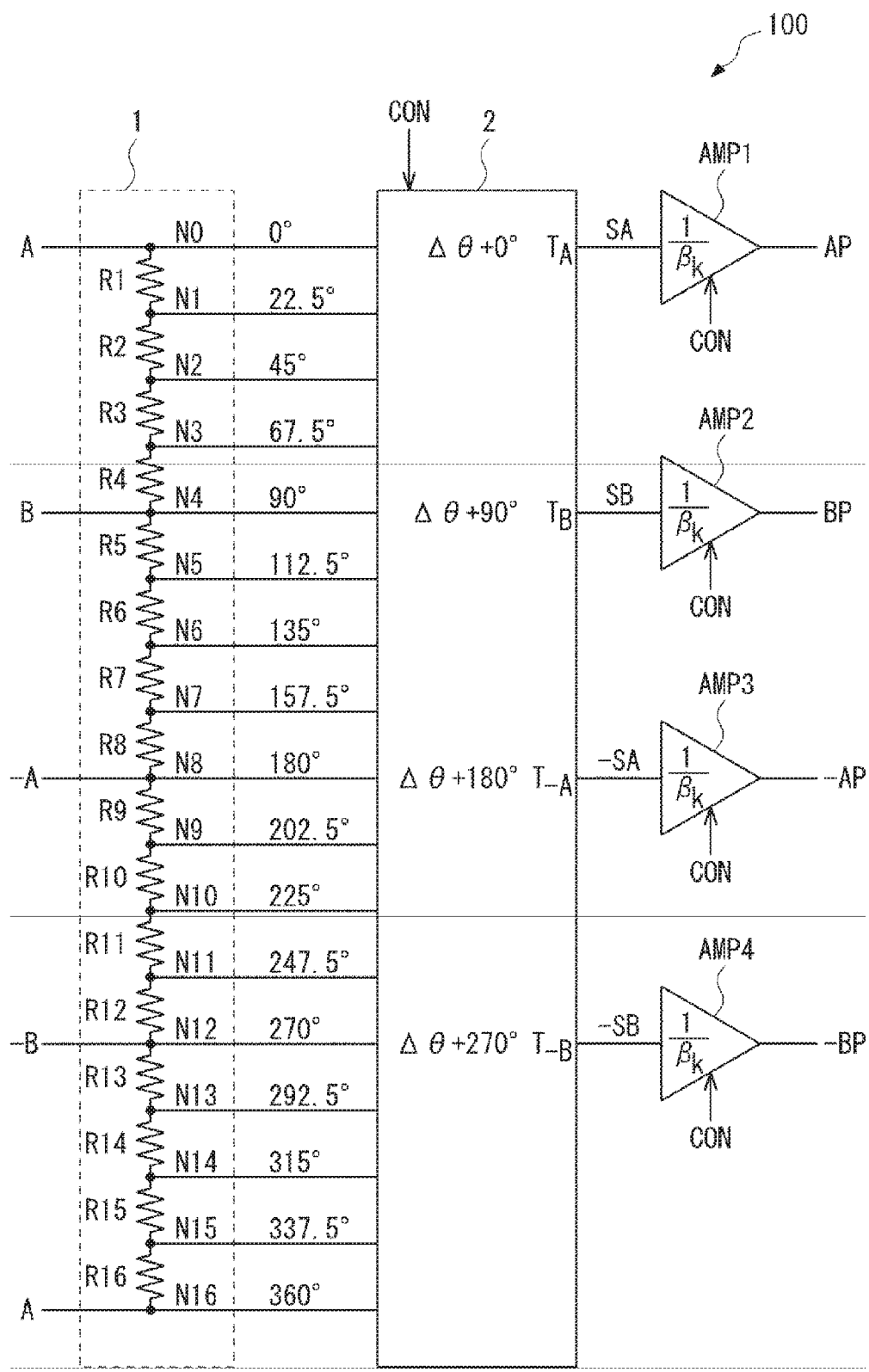
FIG. 1 is a circuit diagram schematically illustrating a configuration of a phase adjuster according to a first embodiment.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the forms of the present invention may be embodied in practice.

Hereafter, embodiments of the present invention are described with reference to the drawings. Identical reference numerals are assigned to identical elements in each of the plurality of drawings, and duplicative descriptions are omitted where necessary.

First Embodiment

A description is given of a phase adjuster 100 according to a first embodiment. The phase adjuster 100 has a configuration capable of outputting a signal, in which a phase A, phase −A, phase B, and phase −B of a four-phase input signal are respectively offset by an identical value.

The phase adjuster 100 is incorporated in an encoder, for example, and offsets by a predetermined value a phase of a four-phase signal which a detection portion (or detector) reads and outputs. In addition, an origin point signal synchronizer incorporated in the encoder determines a position of an origin point of the encoder by synchronizing an origin point signal output from the detection portion with the four-phase signal where the phase is offset.

For example, phase A, phase −A, phase B, and phase −B are represented respectively by the following formulae (4) to (7).

[Formula 4]
$$A = \sin\left(\frac{2\pi x}{\lambda} - 0\right) = \cos\left(\frac{2\pi x}{\lambda}\right) \quad (4)$$

[Formula 5]
$$B = \sin\left(\frac{2\pi x}{\lambda} - 2\pi\frac{1}{4}\right) = \cos\left(\frac{2\pi x}{\lambda} - \frac{\pi}{2}\right) \quad (5)$$

[Formula 6]
$$-A = \sin\left(\frac{2\pi x}{\lambda} - 2\pi\frac{2}{4}\right) = \cos\left(\frac{2\pi x}{\lambda} - \pi\right) \quad (6)$$

[Formula 7]
$$-B = \sin\left(\frac{2\pi x}{\lambda} - 2\pi\frac{3}{4}\right) = \cos\left(\frac{2\pi x}{\lambda} - \frac{3\pi}{2}\right) \quad (7)$$

The phase adjuster 100 has a configuration offsetting each phase of the four-phase input signal being input by Δθ. FIG. 1 is a circuit diagram schematically illustrating the configuration of the phase adjuster 100 according to the first embodiment.

The phase adjuster 100 includes a resistor string 1, a switch portion 2 (or switch), and amplifiers AMP1 to AMP4. The resistor string 1 has a configuration in which a plurality of voltage dividing resistors are connected in cascade. In this example, sixteen resistors R1 to R16 are connected in series. In this case, a first end on the resistor R1 side of the resistor string including resistors R1 to R16 is referred to as a node N0, and a second end on the resistor R16 side is referred to as a node N16. A node between a jth resistor Rj (where j is an integer of 1≤j≤15) as counted from the node N0 and a (j+1)th resistor R(j+1) as counted from the node N0 is referred to as a node Nj.

The phases A, B, −A, −B, and A are directly input respectively to nodes N0, N4, N8, N12, and N16.

Figure 2:
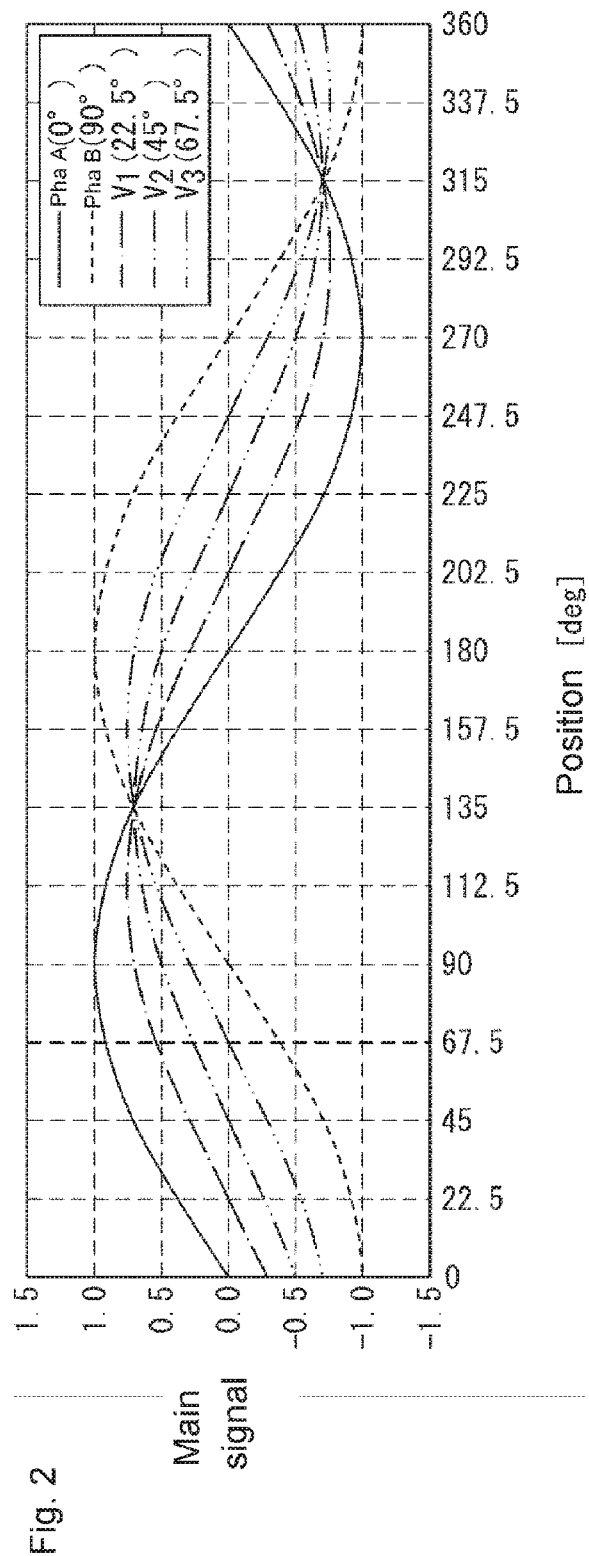
FIG. 2 illustrates a phase A, a phase B, and voltages $V_1$ to $V_3$ of output signals from nodes N1 to N3.

The phase A is output to the switch portion 2 from the node N0. Signals in which the phase A phase is delayed by 22.5°, 45°, and 67.5° respectively are output to the switch portion 2 from the nodes N1 to N3. FIG. 2 illustrates phase A, phase B, and voltages $V_1$ to $V_3$ of output signals from nodes N1 to N3.

The phase B (signal in which the phase A phase is delayed by 90°) is output to the switch portion 2 from the node N4. Signals in which the phase B phase is delayed by 22.5°, 45°, and 67.5° respectively (signals in which the phase A phase is delayed by 112.5°, 135°, and 157.5° respectively) are output to the switch portion 2 from nodes N5 to N7.

The phase −A (signal in which the phase A phase is delayed by 180°) is output to the switch portion 2 from the node N8. Signals in which the phase −A phase is delayed by 22.5°, 45°, and 67.5° respectively (signals in which the phase A phase is delayed by 202.5°, 225°, and 247.5° respectively) are output to the switch portion 2 from nodes N9 to N11.

The phase −B (signal in which the phase A phase is delayed by 270°) is output to the switch portion 2 from the node N12. Signals in which the phase −B phase is delayed by 22.5°, 45°, and 67.5° respectively (signals in which the phase A phase is delayed by 292.5°, 315°, and 337.5° respectively) are output to the switch portion 2 from nodes N13 to N15.

The phase A identical to the node N0 is output to the switch portion 2 from the node N16. In other words, a node Nh (where h is an integer of 0≤h≤16) can be understood as outputting a signal in which the phase A phase is delayed by h×22.5°.

As described above, by using a resistance voltage division obtained by the resistors connected in series between two phases included in the four-phase input signal, a signal is generated in which the phase differs by 22.5°. Described below is a method of determining a resistance value of each resistor achieving the above-noted resistance voltage division. In the above, as an example, a number of resistors connected in series between two phases is four and an adjustment width of the phase is 22.5°. However, the number of resistors, the adjustment width of the phase, and a total number of phases are not limited to this example. In the following, a description is given such that an N number of resistors are connected in series between two adjacent phases included in an M-phase signal (where M is an integer of 2 or more).

Figure 3:
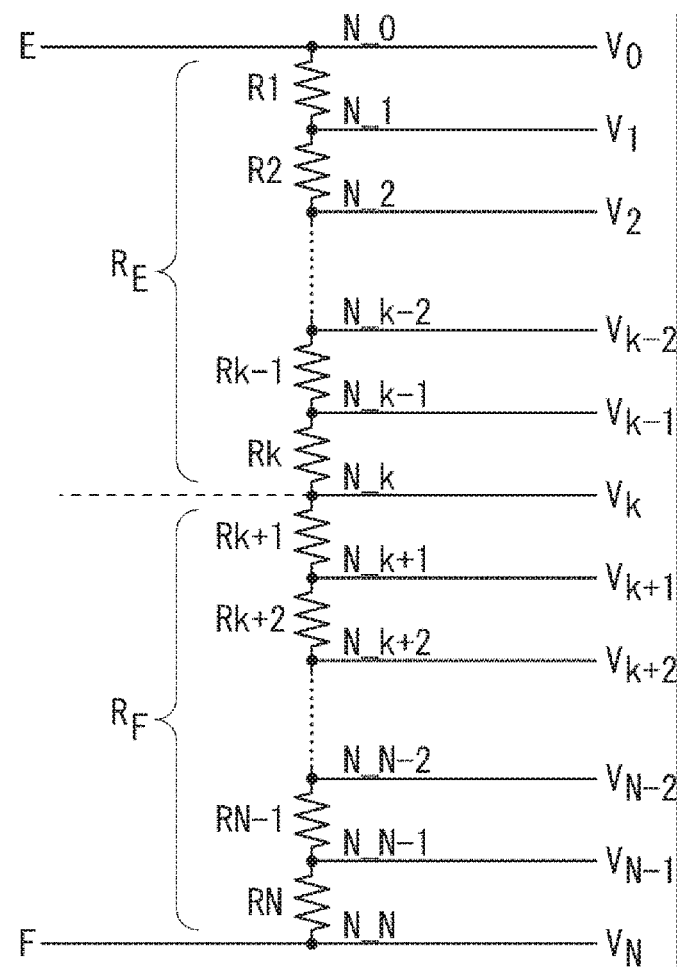
FIG. 3 illustrates resistors connected between a first phase and a second phase.

FIG. 3 illustrates resistors connected between a first phase and a second phase. The first phase is input by the end on the resistor R1 side of the resistor string having resistors R1 to RN and the second phase is input by the end on the resistor RN side. $V_E$ is the voltage of the first phase and $V_F$ is the voltage of the second phase.

First, a voltage $V_k$ of the output signal from the kth node (where k is 1≤k≤N−1) is derived. In this example, a combined resistance of the resistors R1 to Rk on the first phase side from a node $N_k$ is regarded as $R_E$, and a combined resistance of the resistors Rk+1 to RN on the second phase side from the node $N_k$ is regarded as $R_F$. In order to facilitate understanding, FIG. 3 represents nodes N1 to NN as nodes N_1 to N_N. The combined resistances $R_E$ and $R_F$ have the same current, and therefore, are represented by the following formulae (8) and (9) respectively.

[Formula 8]

$$R_E = \sum_{i=1}^{k} R_i \tag{8}$$

[Formula 9]

$$R_F = \sum_{i=k+1}^{N} R_i \tag{9}$$

Further, a resistance $R_{TOTAL}$, a sum of the resistors R1 to RN, is represented by the following formula (10).

[Formula 10]

$$R_{TOTAL} = R_E + R_F = \sum_{i=1}^{N} R_i \tag{10}$$

Furthermore, the resistors R1 to RN in FIG. 3 have the same current, and therefore, the following formula (11) is established.

[Formula 11]

$$\frac{V_E - V_k}{R_E} = \frac{V_F - V_k}{R_F} \tag{11}$$

Solving formula (11) for the voltage $V_k$ gives formula (12).

[Formula 12]

$$V_k = \frac{V_E R_F + V_F R_E}{R_E + R_F} = \frac{V_E R_F + V_F R_E}{R_{TOTAL}} \tag{12}$$

In this example, the voltage $V_E$ of the first phase is defined by the following formula (13).
[Formula 13]

$$V_E = V \sin\theta \tag{13}$$

At this time, the voltage $V_F$ of the second phase is represented by the following formula (14).

[Formula 14]

$$V_F = V\sin\left(\theta + \frac{2\pi}{M}\right) \tag{14}$$

The following formula (15) is obtained when formulae (13) and (14) are substituted into formula (12).

[Formula 15]

$$\begin{aligned} V_k &= \frac{V\sin\theta \cdot R_F + V\sin\left(\theta + \frac{2\pi}{M}\right) \cdot R_E}{R_{TOTAL}} \\ &= \frac{V}{R_{TOTAL}}\left[R_F\sin\theta + R_E\left(\sin\theta \cdot \cos\frac{2\pi}{M} + \cos\theta \cdot \sin\frac{2\pi}{M}\right)\right] \\ &= \frac{V}{R_{TOTAL}}\left[\left(R_F + R_E\cos\frac{2\pi}{M}\right)\sin\theta + R_E\sin\frac{2\pi}{M} \cdot \cos\theta\right] \end{aligned} \tag{15}$$

The voltage $V_k$, compared to the voltage $V_E$ of the first phase, is phase-delayed by 2πk/MN and the voltage drops due to k resistors. When an amplitude of the voltage $V_k$ is defined as $V_{att}$, the voltage $V_k$ is represented by the following formula (16).

[Formula 16]

$$\begin{aligned} V_k &= V_{att}\sin\left(\theta + \frac{2\pi}{M} \cdot \frac{k}{N}\right) \\ &= V_{att}\left[\sin\theta \cdot \cos\frac{2\pi k}{MN} + \cos\theta \cdot \sin\frac{2\pi k}{MN}\right] \end{aligned} \tag{16}$$

Formulae (15) and (16), which are derived as mentioned above, describe the same voltage $V_k$, and therefore, formulae (15) and (16) can be understood to be equivalent. Accordingly, a first term including sine of the formula (15) and a first term including sin θ of the formula (16) are equal to each other and thus the following formula (17) is established.

[Formula 17]

$$\begin{aligned} \frac{V}{R_{TOTAL}} \cdot \left(R_F + R_E\cos\frac{2\pi}{M}\right)\sin\theta &= V_{att}\sin\theta \cdot \cos\frac{2\pi k}{MN} \\ R_F + R_E\cos\frac{2\pi}{M} &= R_{TOTAL}\frac{V_{att}}{V} \cdot \cos\frac{2\pi k}{MN} \end{aligned} \tag{17}$$

In addition, a second term including cos θ of the formula (15) and a second term including cos θ of the formula (16) are equal to each other and thus the following formula (18) is established.

[Formula 18]

$$\begin{aligned} \frac{V}{R_{TOTAL}} \cdot R_E\sin\frac{2\pi}{M} \cdot \cos\theta &= V_{att}\cos\theta \cdot \sin\frac{2\pi k}{MN} \\ R_E\sin\frac{2\pi}{M} &= R_{TOTAL}\frac{V_{att}}{V} \cdot \sin\frac{2\pi k}{MN} \end{aligned} \tag{18}$$

In this example, $\beta_k$ is defined as shown in formula (19). $\beta_k$ can be understood as an attenuation rate for the voltage $V_E$ of the first phase of the voltage $V_k$ and as an amplification factor for the voltage $V_F$ of the second phase.

[Formula 19]

$$\frac{V_{att}}{V} = \beta_k \quad (19)$$

The following formulae (20) and (21) are obtained respectively when substituting formulae (17) and (18) into formula (19).

[Formula 20]

$$R_F + R_E \cos\frac{2\pi}{M} = R_{TOTAL} \cdot \beta_k \cdot \cos\frac{2\pi k}{MN} \quad (20)$$

[Formula 21]

$$R_E \sin\frac{2\pi}{M} = R_{TOTAL} \cdot \beta_k \cdot \sin\frac{2\pi k}{MN} \quad (21)$$

Solving formula (21) for $R_E$ gives the following formula (22).

[Formula 22]

$$R_E = R_{TOTAL} \cdot \beta_k \cdot \frac{\sin\frac{2\pi k}{MN}}{\sin\frac{2\pi}{M}} \quad (22)$$

Substituting formula (22) into formula (20) and then solving for $R_F$ provides the following formula (23).

[Formula 23]

$$R_F + R_{TOTAL} \cdot \beta_k \cdot \frac{\sin\frac{2\pi k}{MN}}{\sin\frac{2\pi}{M}} \cdot \cos\frac{2\pi}{M} = R_{TOTAL} \cdot \beta_k \cdot \cos\frac{2\pi k}{MN} \quad (23)$$

$$R_F = R_{TOTAL} \cdot \beta_k \cdot \frac{\sin\frac{2\pi}{M} \cdot \cos\frac{2\pi k}{MN} - \cos\frac{2\pi}{M} \cdot \sin\frac{2\pi k}{MN}}{\sin\frac{2\pi}{M}}$$

$$= R_{TOTAL} \cdot \beta_k \cdot \frac{\sin\left(\frac{2\pi}{M} - \frac{2\pi k}{MN}\right)}{\sin\frac{2\pi}{M}}$$

Based on formulae (10), (22), and (23), $\beta_k$ is represented by the following formula (24).

[Formula 24]

$$\beta_k = \frac{\sin\frac{2\pi}{M}}{\sin\frac{2\pi k}{MN} + \sin\left(\frac{2\pi}{M} - \frac{2\pi k}{MN}\right)} \quad (24)$$

The combined resistance $R_E$ is represented by the following formula (25) when formula (24) is substituted into formula (22).

[Formula 25]

$$R_E = R_{TOTAL} \cdot \frac{\sin\frac{2\pi}{M}}{\sin\frac{2\pi k}{MN} + \sin\left(\frac{2\pi}{M} - \frac{2\pi k}{MN}\right)} \cdot \frac{\sin\frac{2\pi k}{MN}}{\sin\frac{2\pi}{M}} \quad (25)$$

$$= R_{TOTAL} \cdot \frac{\sin\frac{2\pi k}{MN}}{\sin\frac{2\pi k}{MN} + \sin\left(\frac{2\pi}{M} - \frac{2\pi k}{MN}\right)}$$

By using formula (25), successive determination of the resistance values of the resistors R1 to RN is possible. First, when determining the resistance value of the first resistor R1, based on $R_E$=R1, the resistance value of the resistor R1 is determined to be a value represented by the following formula (26).

[Formula 26]

$$R1 = R_{TOTAL} \cdot \frac{\sin\frac{2\pi}{M}}{\sin\frac{2\pi}{MN} + \sin\left(\frac{2\pi}{M} - \frac{2\pi}{MN}\right)} \quad (26)$$

Next, when determining the resistance value of the second resistor R2, based on R2=$R_E$−R1, the resistance value of the resistor R2 is determined to be the value represented by the following formula (27).

[Formula 27]

$$R2 = R_E - R1 \quad (27)$$

$$= R_{TOTAL} \cdot \frac{\sin\frac{4\pi}{MN}}{\sin\frac{4\pi}{MN} + \sin\left(\frac{2\pi}{M} - \frac{4\pi}{MN}\right)} - R1$$

Subsequently, the resistance value of the kth resistor Rk can be similarly determined to be the value represented by the following formula (28).

[Formula 28]

$$Rk = R_E - \sum_{i=1}^{k-1} R_i \quad (28)$$

For example, the resistance value of the Nth resistor RN can, based on $R_E$=$R_{TOTAL}$, be determined to be the value represented by the following formula (29).

[Formula 29]

$$RN = R_E - \sum_{i=1}^{N-1} R_i \quad (29)$$

$$= R_{TOTAL} - \sum_{i=1}^{N-1} R_i$$

When a specific value is given to $R_{TOTAL}$ during circuit design, the resistance value of the resistors R1 to RN can be specifically determined. Moreover, as noted above, in comparison to the voltage $V_E$ of the first phase, the voltages $V_1$ to $V_{N-1}$ of each node attenuate by a ratio shown by coefficients $\beta_1$ to $\beta_{N-1}$ respectively and the amplitude is reduced. Therefore, the voltages $V_1$ to $V_{N-1}$ of the nodes are output, by amplifiers AMP1 to AMPN provided at a later stage, after being amplified by a factor of $1/\beta_1$ to $1/\beta_{N-1}$ respectively.

Therefore, in the configuration illustrated in FIG. 1, based on N=4 and M=4, the resistance value of resistance values R1 to R4 can be determined as in the following formulae (30) to (33) respectively. According to the configuration illustrated in FIG. 1, needless to say, R1=R5=R9=R13, R2=R6=R10=R14, R3=R7=R11=R15, and R4=R8=R12=R16.

[Formula 30]

$$R1 = R_{TOTAL} \cdot \frac{\sin\frac{2\pi}{16}}{\sin\frac{2\pi}{16} + \cos\frac{2\pi}{16}} \quad (30)$$

[Formula 31]

$$R2 = R_{TOTAL} \cdot \left(\frac{1}{2} - \frac{\sin\frac{2\pi}{16}}{\sin\frac{2\pi}{16} + \cos\frac{2\pi}{16}}\right) \quad (31)$$

[Formula 32]

$$R3 = R_{TOTAL} \cdot \left(\frac{\sin 3\frac{2\pi}{16}}{\sin 3\frac{2\pi}{16} + \cos 3\frac{2\pi}{16}} - \frac{1}{2}\right) \quad (32)$$

[Formula 33]

$$R4 = R_{TOTAL} \cdot \left(1 - \frac{\sin 3\frac{2\pi}{16}}{\sin 3\frac{2\pi}{16} + \cos 3\frac{2\pi}{16}}\right) \quad (33)$$

The switch portion 2 is configured to be capable of switching which nodes are connected to output terminals $T_A$, $T_B$, $T_{-A}$, and $T_{-B}$. Since signals output from the output terminals $T_A$, $T_B$, $T_{-A}$, and $T_{-B}$ are the four-phase signal, the output terminals $T_A$, $T_B$, $T_{-A}$, and $T_{-B}$ are each connected to a node with a phase differing of 90° (i.e., $2\pi/M$). For example, in a case where the output terminal $T_A$ is connected with the node N1, the output terminals $T_B$, $T_{-A}$, and $T_{-B}$ are connected with the nodes N5, N9, and N13 respectively.

Figure 4:
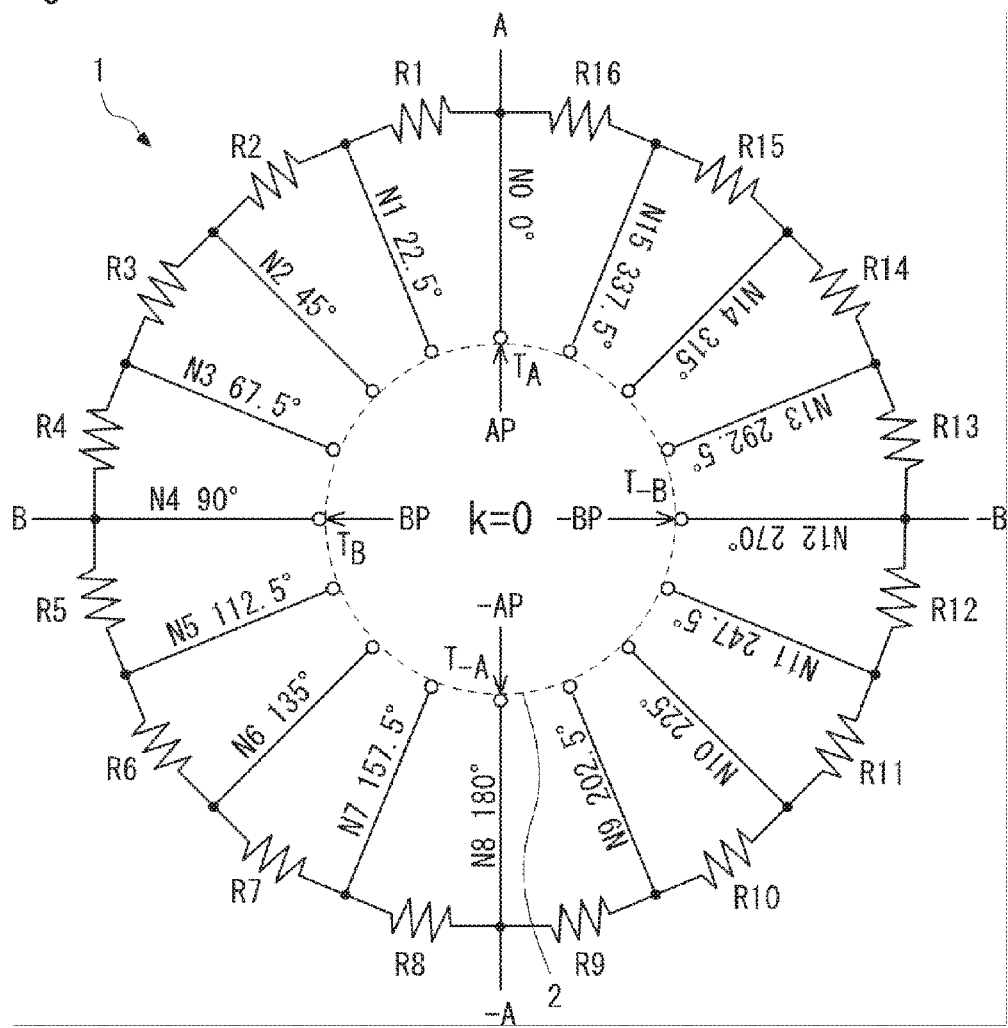
FIG. 4 is a circuit diagram illustrating a configuration of a switch portion.

FIG. 4 is a circuit diagram illustrating a configuration of the switch portion 2. In this example, by connecting the above-noted resistors R1 to RN in a ring shape, a similar configuration to FIG. 1 is achieved. In order to simplify the drawing, FIG. 4 does not show the amplifiers in the later stage of the switch portion. The switch portion 2 includes terminals which can be connected to each of the nodes with a phase difference of 90°, and is configured as a so-called rotary switch. A rotation angle of the switch portion 2 is controlled by a control signal CON from the exterior. FIG. 4 represents a situation when the phase offset is 0. The control signal CON may be given by a control device provided inside the encoder, or given in accordance with the phase offset amount a user desires for the encoder.

Figure 5:
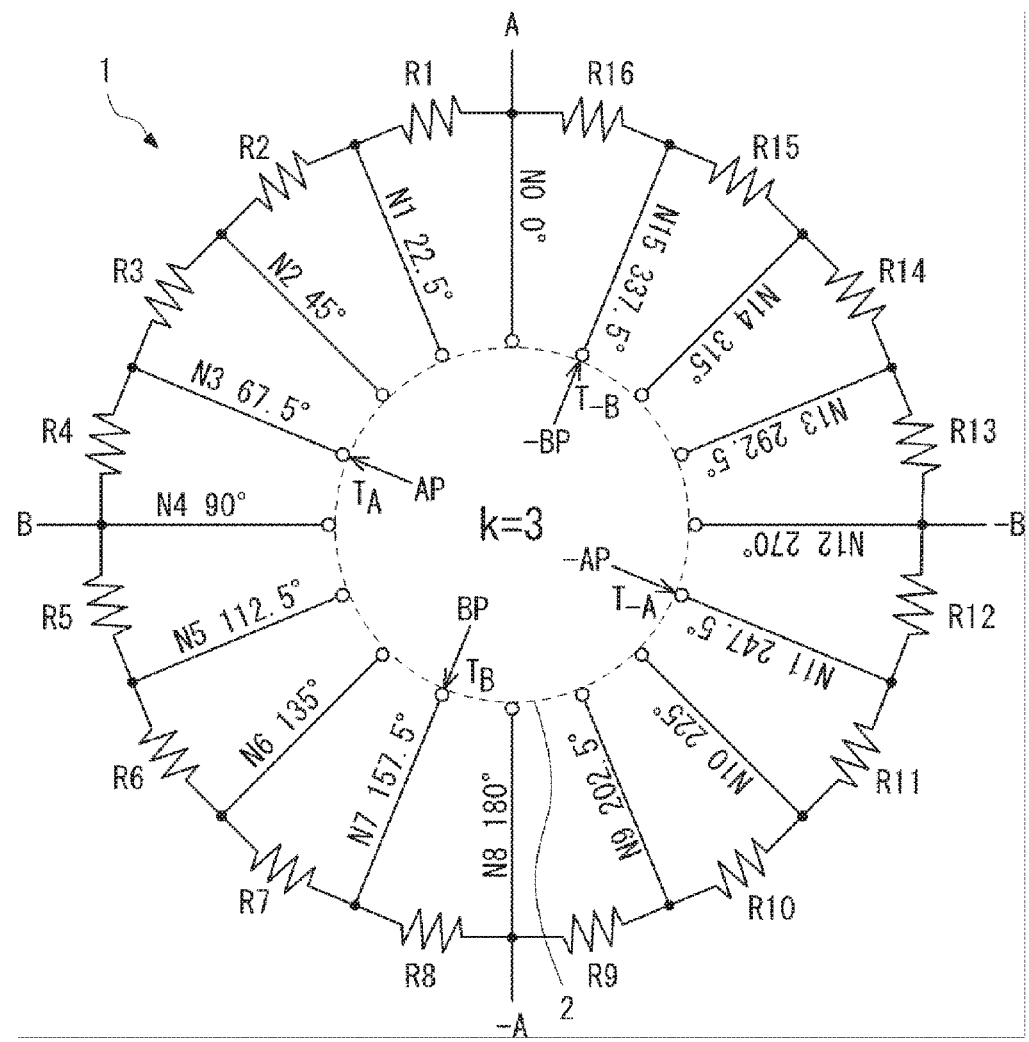
FIG. 5 is a circuit diagram illustrating the switch portion during a phase offset of 67.5° (k=3)

FIG. 5 is a circuit diagram illustrating the switch portion 2 during the phase offset of 67.5° (k=3). In order to simplify the drawing, similar to FIG. 4, FIG. 5 does not show the amplifiers in the later stage of the switch portion. In this case, the output terminal $T_A$ is connected with the node N3 (67.5°), the output terminal $T_B$ with the node N7 (157.5°), the output terminal $T_{-A}$ with the node N11 (247.5°), and the output terminal $T_{-B}$ with the node N15 (337.5°).

From the output terminals $T_A$, $T_B$, $T_{-A}$, and $T_{-B}$, four-phase signals SA, SB, −SA, and −SB which have undergone the phase offset are respectively output. The four-phase signals SA, SB, −SA, and −SB are amplified by $1/\beta_k$ through variable amplifiers AMP1 to AMP4 in the later stage, respectively. The amplified signals are output as four-phase output signals AP, BP, −AP, and −BP with the amplitude aligned.

Accordingly, the phase adjuster 100 can output the four-phase output signals AP, BP, −AP, and −BP obtained by respectively offsetting the phase of the phases A, B, −A, and −B by 67.5° (k=3).

As noted above, the phase adjuster 100 can, by a simple resistor string, delay the phase of a multi-phase signal by an offset amount smaller than 90°, which can be understood as enabling more precise phase adjustments. Further, the offset amount can be easily adjusted by a number of voltage dividing resistors provided, and therefore, the phase offset amount can be configured according to the required accuracy.

Second Embodiment

In the above-described first embodiment, a specific example was described in which the phase adjuster outputs the four-phase output signal obtained by offsetting the phases of the four-phase input signal. In this example, other specific examples are further considered by illustrating a configuration of a switch portion configured as a rotary switch. Moreover, in order to simplify the drawings, amplifiers in the later stage of the switch portion are omitted from the following drawings.

First Exemplary Configuration

An example is described of outputting a three-phase output signal in which a predetermined phase offset is imposed based on a three-phase input signal. In this example, each phase of the three-phase input signal is designated as phase A (0°), phase B (120°), and phase C (240°). The three-phase output signals are designated respectively as AP (0°+Δθ), BP (120°+Δθ), and CP (240°+Δθ).

Figure 6:
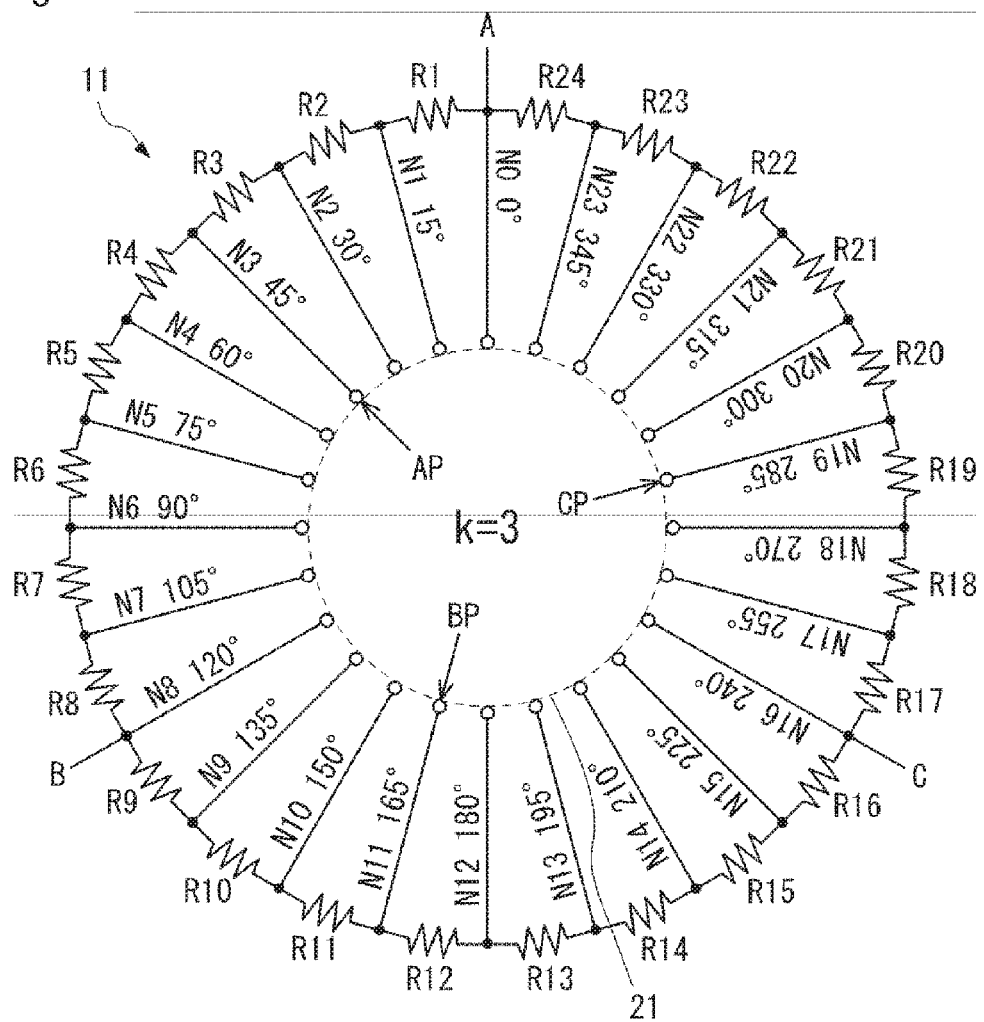
FIG. 6 is a circuit diagram illustrating a resistor string 11 and a switch portion 21 outputting a three-phase output signal when a predetermined phase offset is given based on a three-phase input signal.

FIG. 6 is a circuit diagram illustrating a resistor string 11 and a switch portion 21 outputting the three-phase output signal in which the predetermined phase offset is imposed based on the three-phase input signal. The resistor string 11 is configured such that the resistors R1 to R24 are connected in a ring shape. In other words, in this example, eight resistors (N=8) are inserted between each at the adjacent signals of the three-phase input signal (M=3). Therefore, a width of the phase offset is 15°. In order to output the three-phase output signal, the switch portion 21 is configured as a rotary switch including terminals which can be connected to each of the nodes with a phase difference of 120°. A rotation angle of the switch portion 21 is controlled by the control signal CON from the exterior.

FIG. 6 illustrates a case when the phase offset is 45° (k=3). In this case, the three-phase output signals AP, BP, and CP are output from the nodes N3 (45°), N11 (165°), and N19 (285°).

Second Exemplary Configuration

An example is described of outputting a three-phase output signal in which a predetermined phase offset is imposed based on a six-phase input signal. In this example, each phase of the six-phase input signal is designated as phase A (0°), phase B (60°), phase C (120°), phase −A (180°), phase −B (240°), and phase −C (300°). The three-phase output signals are designated respectively as AP (0°+Δθ), BP (120°+Δθ), and CP (240°+Δθ).

Figure 7:
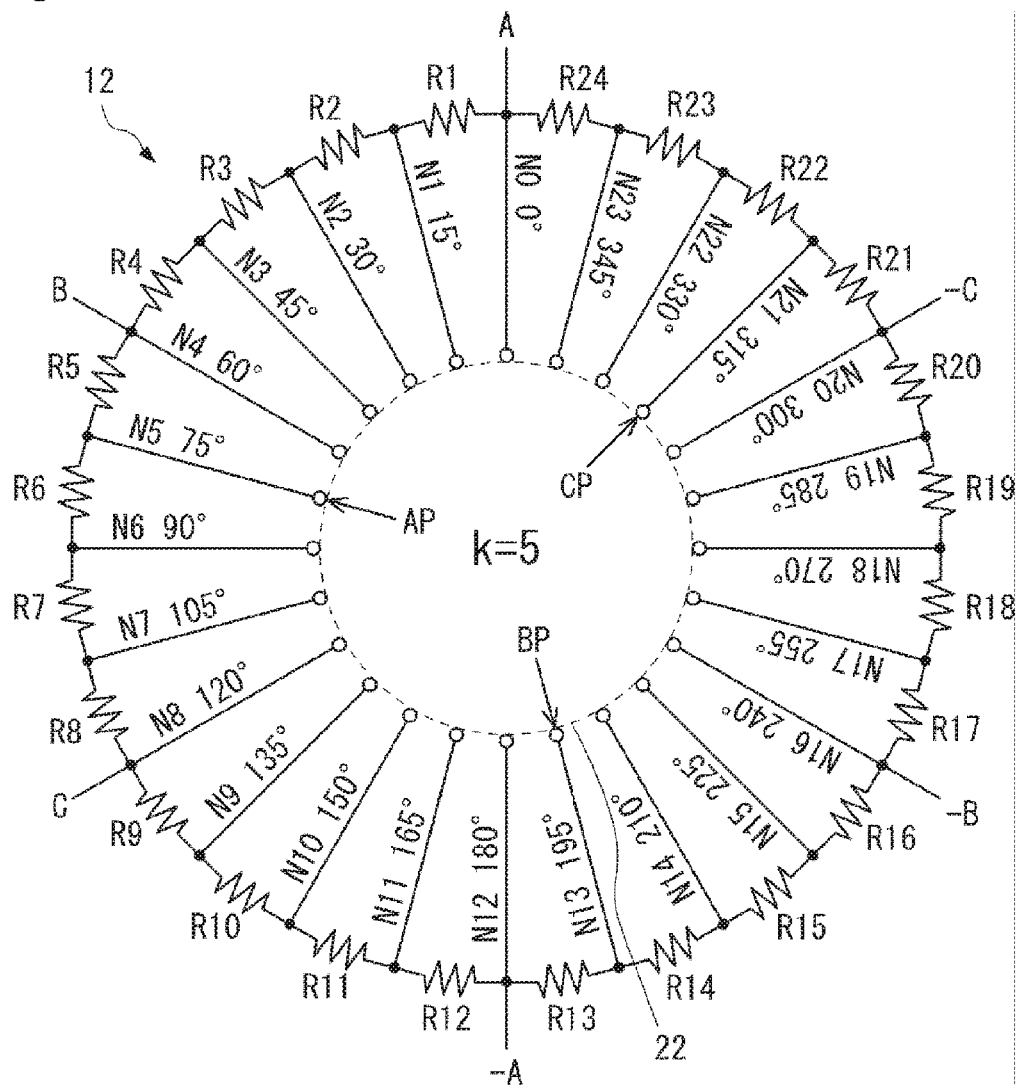
FIG. 7 is a circuit diagram illustrating a resistor string 12 and a switch portion 22 outputting a three-phase output signal when a predetermined phase offset is given based on a three-phase input signal.

FIG. 7 is a circuit diagram illustrating a resistor string 12 and a switch portion 22 outputting the three-phase output signal in which the predetermined phase offset is imposed based on the six-phase input signal. The resistor string 12 is configured, similarly to the first exemplary configuration, such that the resistors R1 to R24 are connected in a ring shape. Therefore, in this example, four resistors (N=4) are inserted between each of the adjacent signals of the six-phase input signal (M=6). Accordingly, the width of the phase offset is 15°. In order to output the three-phase output signal, the switch portion 22 is configured as a rotary switch including terminals which can be connected to each of the nodes with a phase difference of 120°. A rotation angle of the switch portion 22 is controlled by the control signal CON from the exterior.

FIG. 7 illustrates a case when the phase offset is 75° (k=5). In this case, the three-phase output signals AP, BP, and CP are output from the nodes N5 (75°), N13 (195°), and N21 (315°).

Third Exemplary Configuration

An example is described of outputting a four-phase output signal in which a predetermined phase offset is imposed based on a three-phase input signal. In this example, each phase of the three-phase input signal is designated as phase A (0°), phase B (120°), and phase C (240°). The four-phase output signals are designated respectively as AP (0°+Δθ), BP (90°+Δθ), −AP (180°+Δθ), and −BP (270°+Δθ).

Figure 8:
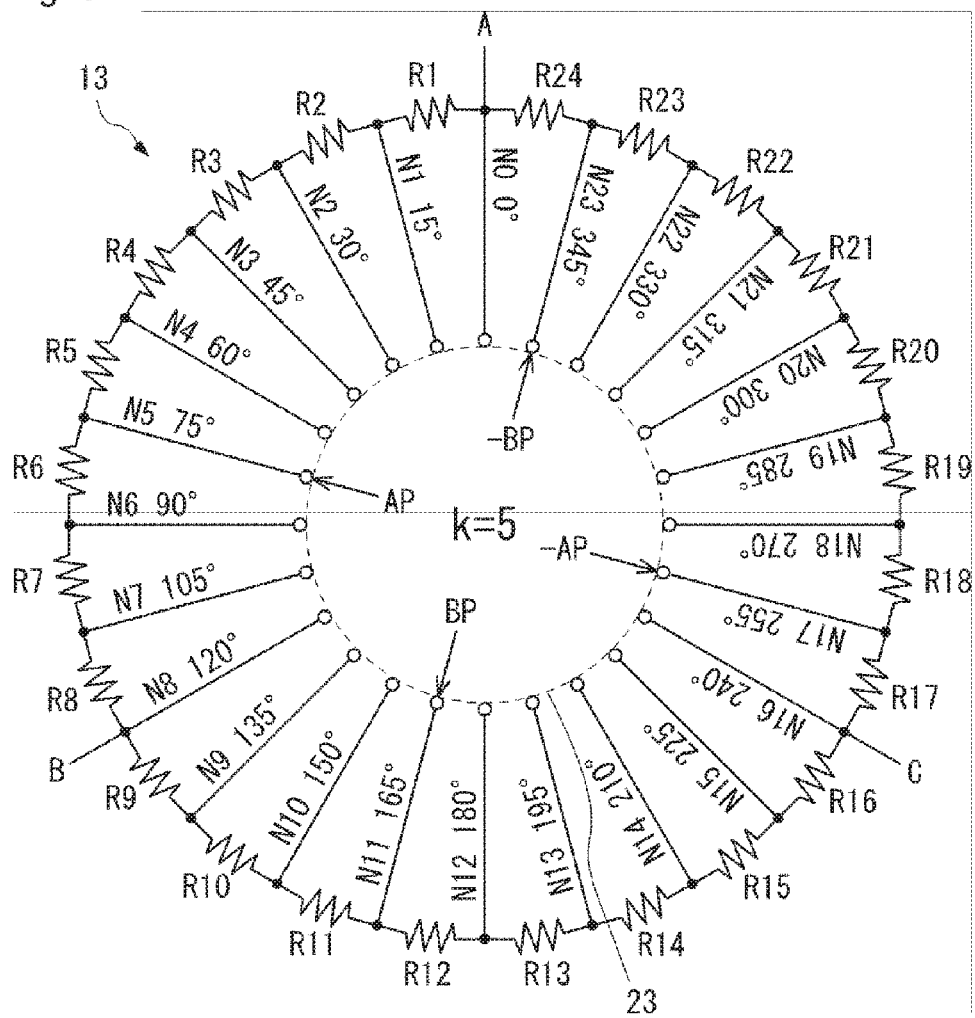
FIG. 8 is a circuit diagram illustrating a resistor string 13 and a switch portion 23 outputting a four-phase output signal when a predetermined phase offset is given based on a three-phase input signal.

FIG. 8 is a circuit diagram illustrating a resistor string 13 and a switch portion 23 outputting the four-phase output signal in which the predetermined phase offset is imposed based on the three-phase input signal. The resistor string 13 is similar to the resistor string 11 according to the first exemplary configuration, and descriptions thereof are omitted. In order to output the four-phase output signal, the switch portion 23 is configured as a rotary switch including terminals which can be connected to each of the nodes with a phase difference of 90°. A rotation angle of the switch portion 23 is controlled by the control signal CON from the exterior.

FIG. 8 illustrates a case when the phase offset is 75° (k=5). In this case, the four-phase output signals AP, BP, −AP, and −BP are output from the nodes N5 (75°), N11 (165°), N17 (255°), and N23 (345°).

Fourth Exemplary Configuration

An example is described of outputting a four-phase output signal in which a predetermined phase offset is imposed based on a six-phase input signal. In this example, each phase of the six-phase input signal is designated as phase A (0°), phase B (60°), phase C (120°), phase −A (180°), phase −B (240°), and phase −C (300°). The four-phase output signals are designated respectively as AP (0°+Δθ), BP (90°+Δθ), −AP (180°+M), and −BP (270°+Δθ).

Figure 9:
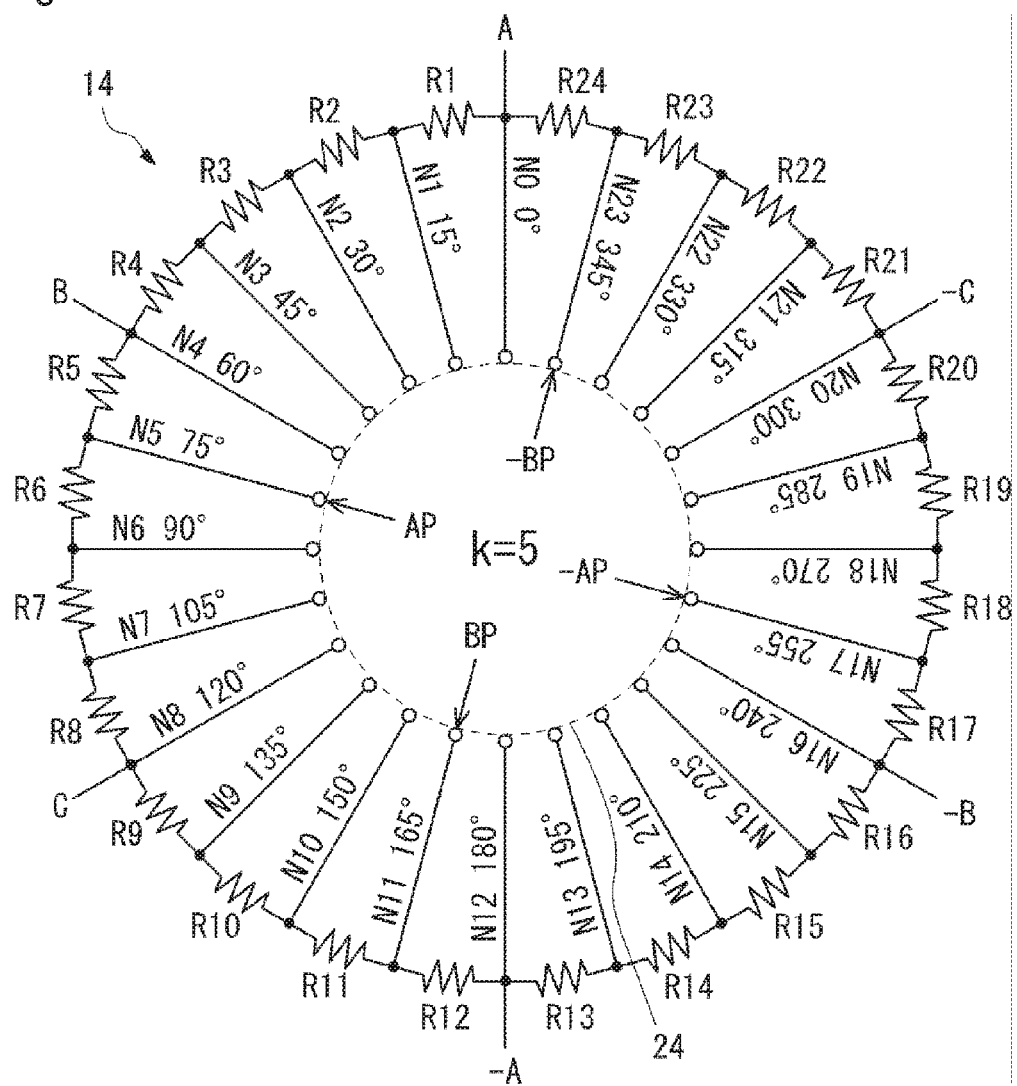
FIG. 9 is a circuit diagram illustrating a resistor string 14 and a switch portion 24 outputting a four-phase output signal when a predetermined phase offset is given based on a three-phase input signal.

FIG. 9 is a circuit diagram illustrating a resistor string 14 and a switch portion 24 outputting the four-phase output signal in which the predetermined phase offset is imposed based on the six-phase input signal. The resistor string 14 is similar to the resistor string 12 according to the second exemplary configuration, and descriptions thereof are omitted. The switch portion 24 is similar to the switch portion 23 according to the third exemplary configuration, and descriptions thereof are omitted.

FIG. 9 illustrates a case when the phase offset is 75° (k=5). In this case, the four-phase output signals AP, BP, −AP, and −BP are output from the nodes N5 (75°), N11 (165°), N17 (255°), and N23 (345°).

Fifth Exemplary Configuration

An example is described of outputting an eight-phase output signal in which a predetermined phase offset is imposed based on a four-phase input signal. In this example, each phase of the four-phase input signal is designated as phase A (0°), phase B (90°), phase −A (180°), and phase −B (270°). The eight-phase output signals are designated respectively as AP (0°+Δθ), BP (45°+Δθ), CP (90°+Δθ), DP (135°+Δθ), −AP (180°+Δθ), −BP (225°+Δθ), −CP (270°+Δθ), and −DP (315°+Δθ).

Figure 10:
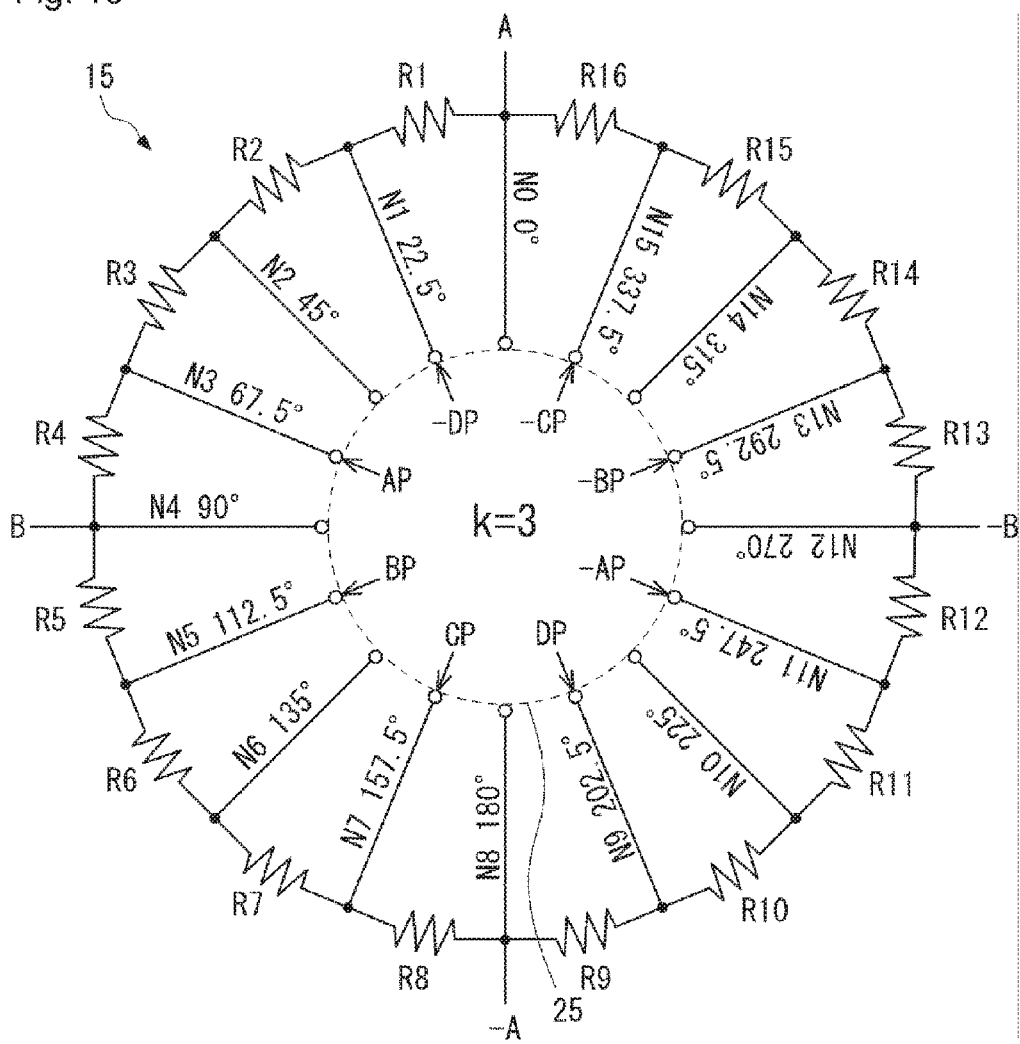
FIG. 10 is a circuit diagram illustrating a resistor string 15 and a switch portion 25 outputting an eight-phase output signal when a predetermined phase offset is given based on a four-phase input signal.

FIG. 10 is a circuit diagram illustrating a resistor string 15 and a switch portion 25 outputting the eight-phase output signal when the predetermined phase offset is imposed based on the four-phase input signal. The resistor string 15 is similar to the resistor string 1 according to the first embodiment, and descriptions thereof are omitted. In order to output the eight-phase output signal, the switch portion 25 is configured as a rotary switch including terminals which can be connected to each of the nodes with a phase difference of 45°. A rotation angle of the switch portion 25 is controlled by the control signal CON from the exterior.

FIG. 10 illustrates a case when the phase offset is 67.5° (k=3). In this case, the eight-phase output signals AP, BP, CP, DP, −AP, −BP, −CP and −DP are output from the nodes N3 (67.5°, N5 (112.5°), N7 (157.5°), N9 (202.5°), N11 (247.5°), N13 (292.5°), and N15 (337.5°), and N1 (22.5° (385.5°)).

Sixth Exemplary Configuration

An example is described of outputting a four-phase output signal in which a predetermined phase offset is imposed based on an eight-phase input signal. In this example, each phase of the eight-phase input signal is designated as phase A (0°), phase B (45°), phase C (90°), phase D (135°), phase −A (180°), phase −B (225°), phase −C (270°), and phase −D (315°). The four-phase output signals are designated respectively as AP (0°+Δθ), BP (90°+Δθ), −AP (180°+Δθ), and −BP (270°+Δθ).

Figure 11:
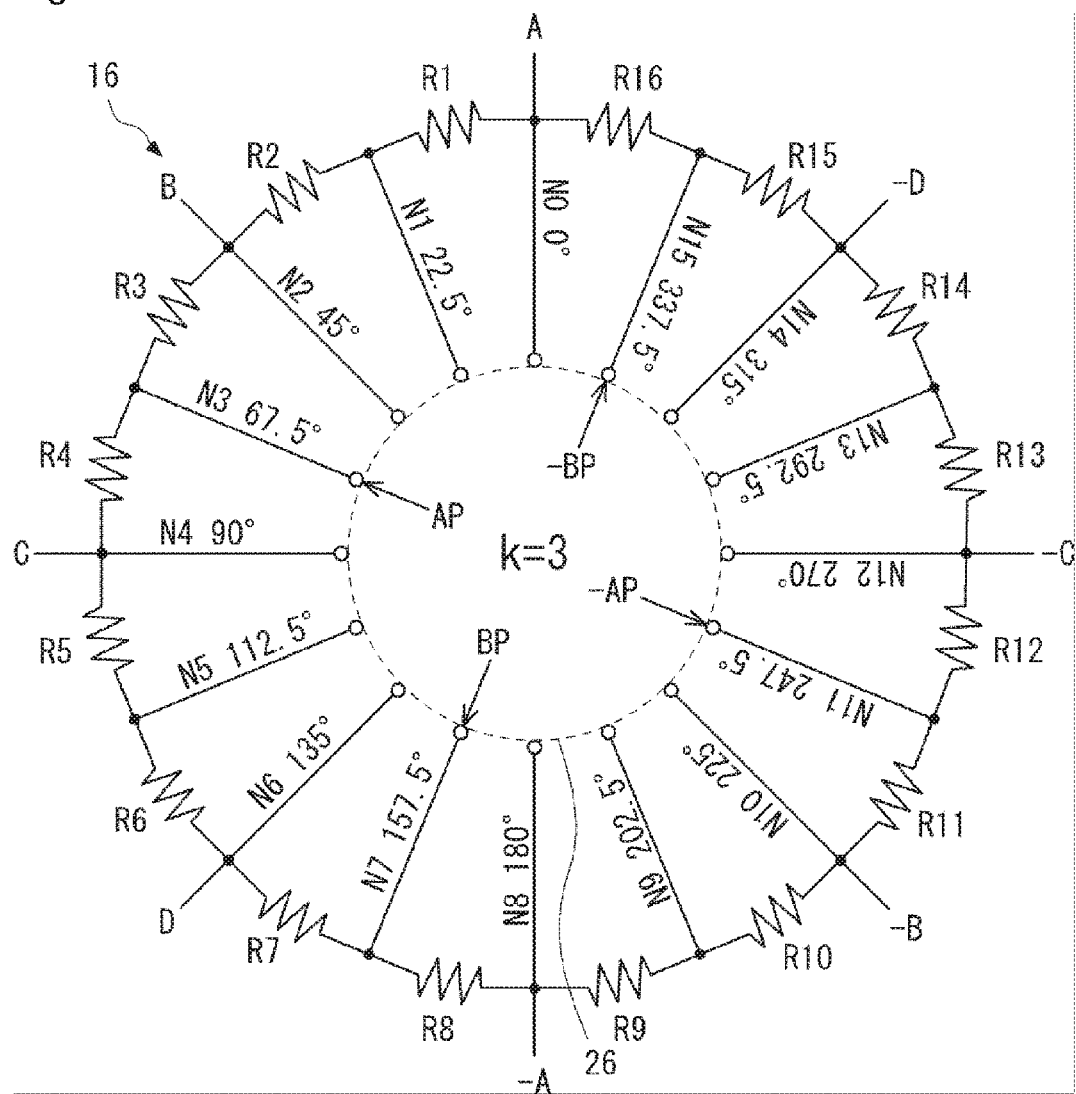
FIG. 11 is a circuit diagram illustrating a resistor string 16 and a switch portion 26 outputting a four-phase output signal when a predetermined phase offset is given based on an eight-phase input signal.
Figure 12:
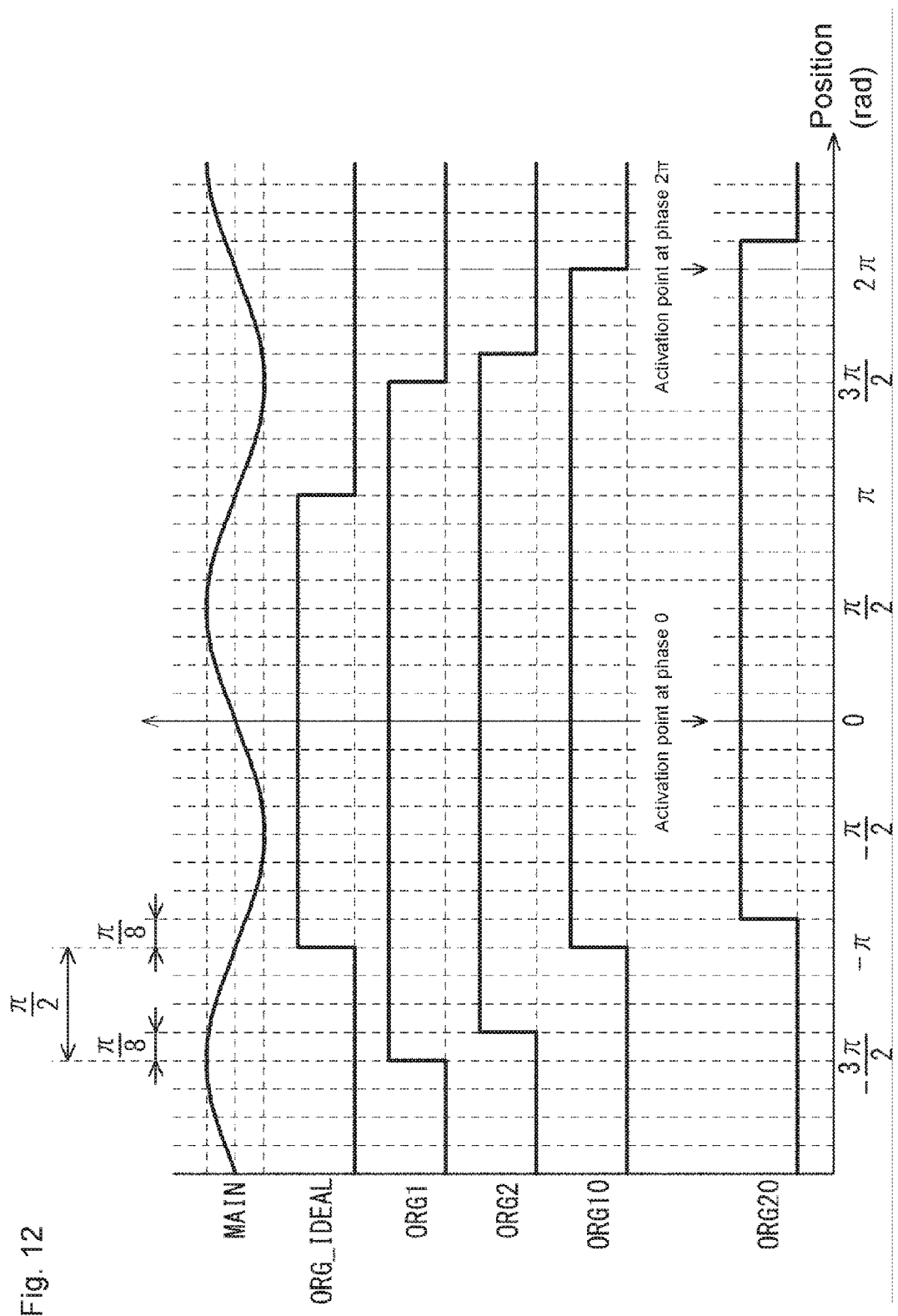
FIG. 12 illustrates a synchronization of a main signal and an origin point signal when a pulse width of the origin point signal is large.

FIG. 11 is a circuit diagram illustrating a resistor string 16 and a switch portion 26 outputting the four-phase output signal in which the predetermined phase offset is imposed based on the eight-phase input signal. The resistor string 16 is similar to the resistor string 1 according to the first embodiment, and descriptions thereof are omitted. The switch portion 26 is similar to the switch portion 2 according to the first embodiment, and descriptions thereof are omitted.

FIG. 11 illustrates a case when the phase offset is 67.5° (k=3). In this case, the four-phase output signals AP, BP, −AP, and −BP are output from the nodes N3 (67.5°), N7 (157.5°), N11 (247.5°), and N15 (337.5°).

Other Embodiments

Moreover, the present invention is not limited to the embodiments described above, and may be modified as needed without departing from the scope of the present invention. For example, in the above-description, the multi-phase signal being input to the resistor string may be input through a buffer.

The multi-phase signal being input to the resistor string may transform, prior to being input to the resistor string, a number of phases using a phase conversion circuit and the like (for example, transform a three-phase signal to a four-phase signal).

In the above, a case was described in which a phase adjuster is used in an encoder, however, the present invention can of course be applied to other devices using a multi-phase signal other than the encoder.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. A phase adjuster, comprising:
a resistor string configured to output an MN number of signals with a phase difference of $2\pi/MN$ by dividing voltage between two adjacent phases of an M-phase input signal with a phase difference of $2\pi/M$, where MN is the product of M and N, and M is an integer of at least 2, the resistor string further configured to generate an N number of signals, where N is an integer of at least 2 with a phase delay for each of the phases of the M-phase input signal;
a switch configured to select an L number of signals with a phase difference of $2\pi/L$, where L is an integer of at least 2, from the MN signals; and
an L number of amplifiers configured to output an L-phase output signal, where L is the integer of at least 2, by amplifying each of the L number of signals attenuated by dividing the voltage with the resistor string such that an amplitude of the L number of signals matches the amplitude of the M-phase input signal.

2. A phase adjuster, comprising:
a resistor string configured to output an MN number of signals with a phase difference of $2\pi/MN$ by dividing voltage between two adjacent phases of an M-phase input signal with a phase difference of $2\pi/M$, where MN is the product of M and N, and M is an integer of at least 2, the resistor string further configured to generate an N number of signals, where N is an integer of at least 2 with a phase delay for each of the phases of the M-phase input signal;
a switch configured to select an L number of signals with a phase difference of $2\pi/L$, where L is an integer of at least 2, from the MN signals; and
an L number of amplifiers configured to output an L-phase output signal, where L is the integer of at least 2, by amplifying each of the L number of signals attenuated by dividing the voltage with the resistor string such that an amplitude of the L number of signals matches the amplitude of the M-phase input signal,
wherein a first phase, which is one of the two adjacent phases of the M-phase input signal, is inputtable to a first end of an N number of serially connected resistors, and
a second phase, which is another phase of the two adjacent phases of the M-phase input signal, is inputtable to a second end of the N number of serially connected resistors.

3. The phase adjuster according to claim 2,
wherein when a combined resistance of the N number of serially connected resistors is defined as $R_{TOTAL}$, a combined resistance $R_E$ of a k number of resistors, which is counted kth from the first phase side, where k is an integer fulfilling a relationship $1 \leq k \leq N$, among the N number of serially connected resistors, is expressed by:

$$R_E = R_{TOTAL} \cdot \frac{\sin\frac{2\pi}{M}}{\sin\frac{2\pi k}{MN} + \sin\left(\frac{2\pi}{M} - \frac{2\pi k}{MN}\right)} \cdot \frac{\sin\frac{2\pi k}{MN}}{\sin\frac{2\pi}{M}} \quad (1)$$

$$= R_{TOTAL} \cdot \frac{\sin\frac{2\pi k}{MN}}{\sin\frac{2\pi k}{MN} + \sin\left(\frac{2\pi}{M} - \frac{2\pi k}{MN}\right)},$$

and
wherein Rk is a resistance value of the kth resistor, as counted from the first phase side among the N number of serially connected resistors, and is expressed by:

$$Rk = R_E - \sum_{i=1}^{k-1} R_i. \quad (2)$$

4. The phase adjuster according to claim 3,
wherein each of the L number of amplifiers is configured to amplify a signal being output from between the kth resistor and a k+1th resistor, as counted from the first phase side, by $1/\beta_k$, and $\beta_k$ is expressed below as:

$$\beta_k = \frac{\sin\frac{2\pi}{M}}{\sin\frac{2\pi k}{MN} + \sin\left(\frac{2\pi}{M} - \frac{2\pi k}{MN}\right)}. \quad (3)$$

5. The phase adjuster according to claim 2,
wherein the MN number of resistors in the resistor string are serially connected in a ring shape, and
the switch is a rotary switch including a terminal which is connectable to a node separated by an MN/L number of nodes among the MN number of nodes between the MN number of resistors.

6. The phase adjuster according to claim 3,
wherein the MN number of resistors in the resistor string are serially connected in a ring shape, and
the switch is a rotary switch including a terminal which is connectable to a node separated by an MN/L number of nodes among the MN number of nodes between the MN number of resistors.

7. The phase adjuster according to claim 4,
wherein the MN number of resistors in the resistor string are serially connected in a ring shape, and
the switch is a rotary switch including a terminal which is connectable to a node separated by an MN/L number of nodes among the MN number of nodes between the MN number of resistors.

8. An encoder, comprising:

a phase adjuster, including a resistor string configured to output an MN number of signals with a phase difference of $2\pi/MN$ by dividing voltage between two adjacent phases of an M-phase input signal with a phase difference of $2\pi/M$, where MN is the product of M and N, and M is an integer of at least 2, the resistor string further configured to generate an N number of signals, where N is an integer of at least 2 with a phase delay for each of the phases of the M-phase input signal;

a switch configured to select an L number of signals with a phase difference of $2\pi/L$, where L is an integer of at least 2, from the MN signals; and an L number of amplifiers configured to output an L-phase output signal, where L is the integer of at least 2, by amplifying each of the L number of signals attenuated by dividing the voltage with the resistor string such that an amplitude of the L number of signals matches the amplitude of the M-phase input signal;

a detector configured to read and output an origin point signal and the M-phase input signal, which is a main signal; and an origin point signal synchronizer configured to determine a position of the origin point by synchronizing the origin point signal and the L-phase output signal.

9. An encoder, comprising:

the phase adjuster according to claim 2;

a detector configured to read and output an origin point signal and the M-phase input signal, which is a main signal; and an origin point signal synchronizer configured to determine a position of the origin point by synchronizing the origin point signal and the L-phase output signal.

10. An encoder, comprising:

the phase adjuster according to claim 3;

a detector configured to read and output an origin point signal and the M-phase input signal, which is a main signal; and an origin point signal synchronizer configured to determine a position of the origin point by synchronizing the origin point signal and the L-phase output signal.

11. An encoder, comprising:

the phase adjuster according to claim 4;

a detector configured to read and output an origin point signal and the M-phase input signal, which is a main signal; and an origin point signal synchronizer configured to determine a position of the origin point by synchronizing the origin point signal and the L-phase output signal.

12. An encoder, comprising:

the phase adjuster according to claim 5;

a detector configured to read and output an origin point signal and the M-phase input signal, which is a main signal; and an origin point signal synchronizer configured to determine a position of the origin point by synchronizing the origin point signal and the L-phase output signal.

13. An encoder, comprising:

the phase adjuster according to claim 6;

a detector configured to read and output an origin point signal and the M-phase input signal, which is a main signal; and an origin point signal synchronizer configured to determine a position of the origin point by synchronizing the origin point signal and the L-phase output signal.

14. An encoder, comprising:

the phase adjuster according to claim 7;

a detector configured to read and output an origin point signal and the M-phase input signal, which is a main signal; and an origin point signal synchronizer configured to determine a position of the origin point by synchronizing the origin point signal and the L-phase output signal.

* * * * *